United States Patent [19]

Mitterhummer et al.

[11] 4,045,863
[45] Sept. 6, 1977

[54] METHOD OF PRODUCING METALLIC CARRIER SYSTEM FOR A MULTI-ELECTRODE SEMICONDUCTOR STRIP

[75] Inventors: Gerhard Mitterhummer; Hanns-Heinz Peltz; Heinrich Mayer, all of Munich; Fritz Conzelmann, Koeigsbrunn, all of Germany

[73] Assignee: Siemens Aktiengesellschaft, Berlin & Munich, Germany

[21] Appl. No.: 718,824

[22] Filed: Aug. 30, 1976

Related U.S. Application Data

[60] Continuation of Ser. No. 385,163, Aug. 2, 1973, abandoned, which is a division of Ser. No. 259,399, June 5, 1972, abandoned.

[30] Foreign Application Priority Data

June 3, 1971 Germany .......................... 2126533

[51] Int. Cl.² .......................... B01J 17/00; C23F 1/02
[52] U.S. Cl. .......................... 29/588; 29/591; 29/627; 156/151; 156/634; 156/661; 204/15; 357/70
[58] Field of Search .......................... 156/3, 8, 11, 18, 150, 156/151, 629, 633, 634, 664, 659, 661; 204/15; 29/580, 588–591, 627; 96/36.2; 357/69, 70, 72, 73; 317/101; 174/52; 427/82

[56] References Cited

U.S. PATENT DOCUMENTS

| | | | |
|---|---|---|---|
| 3,139,392 | 6/1964 | Mears | 204/15 |
| 3,324,530 | 6/1967 | Sherwood et al. | 96/36.2 X |
| 3,680,206 | 8/1972 | Roberts | 29/580 |
| 3,773,628 | 11/1973 | Misawa et al. | 204/15 |

*Primary Examiner*—William A. Powell
*Attorney, Agent, or Firm*—Hill, Gross, Simpson, Van Santen, Steadman, Chiara & Simpson

[57] ABSTRACT

Method of producing a metallic carrier system mounting, making conductive contact with a semi-conductor member through relatively thin tongue-like inner feed lines made from a different metal than the metal of the carrier. The inner feed lines are made from a metal that can readily be connected with the electrodes of the semi-conductor, such as nickel. The thin feed lines extend from the outer support and connection legs and are made from a different metal that can readily be soldered, such as brass and have conductive contact with said legs. The inner feed lines and carrier are made by an etching process. The inner feed lines supporting the semi-conductor are resilient, and by their resiliency balance thermal expansion between the semi-conductor substrate and the coarse structure of the connection legs of the system carrier.

6 Claims, 10 Drawing Figures

I-I

III-III

METHOD OF PRODUCING METALLIC CARRIER SYSTEM FOR A MULTI-ELECTRODE SEMICONDUCTOR STRIP

RELATED APPLICATIONS

This is a continuation of application Ser. No. 385,163, filed Aug. 2, 1973 which is now abandoned. Application Ser. No. 385,163 was in turn a divisional application of Ser. No. 259,399, filed June 5, 1972 which is now abandoned.

BACKGROUND, SUMMARY AND ADVANTAGES OF INVENTION

Method of producing a metallic carrier systems for supporting semi-conductor elements have heretofore comprised an outer frame with individual feed lines extending tongue-like toward the center of the frame, and in the band plane. One of these tongue-like feed lines has served as a carrier for the semi-conductor chip and is attached thereto by means of welding or soldering or gluing. The other feed lines extend ahead of the semi-conductor chip and are conductively connected with the associated electrodes of the semi-conductor chip by fine wires. The entire assembly is then frequently imbedded in a plastic, ceramic or glass housing. While such a carrier system has been satisfactory, the connections from the ends of the feed lines to the semi-conductor chip must be done by hand, usually through the help of a microscope or strong glass, and are very laborious and tedious operations.

Another method of mounting and contacting the semi-conductor chip is described in the German Offenlegengesschrift 1,930,627 in which one or several monolithic semi-conductor components are applied onto a carrier plate provided with conductor paths in the form of a thin-film circuit. The conductor paths at the connection points are welded to the connection paths of the semi-conductor components, with the connection extending to the outside and produced by means of etching from a copper lined aluminum sheet. Such a contacting means makes it unnecessary to solder the connection wires, but is relatively complicated and expensive to manufacture.

A further method for supporting and providing contact with a semi-conductor member having a plurality of electrodes has consisted in a system of electric feed lines, produced from metal sheet, which extend tongue-like from a mounting frame into the interior of the frame and are conductively connected with the individual electrodes of the semi-conductor member. This metallic carrier system may be made by punching or etching, but is difficult to manufacture and particularly to produce the fine structure of the feed lines and the coarse structure of the connecting legs in one piece, and requires extremely careful workmanship.

The present invention provides a metallic carrier system for mounting and contacting a semi-conductor chip and method of producing the same, which can be produced in a simple and expeditious manner.

In carrying out the invention, the simplicity in production of the carrier system is attained by using a comparatively inexpensive metal for the relatively thick support and connection legs and a different metal, which may readily be connected to the electrodes of a semi-conductor chip for the relatively thin inner feed lines, to facilitate the connection of the inner feed lines to the electrodes of a semi-conductor chip.

It is particularly advantageous to make the outer connection legs from brass and the inner feed lines from nickel and to so form the inner feed lines as to have uniformly curved expansion sections intermediate their ends curving out of the planes of the feed lines, to provide an accordian effect and increase the yieldability of the feed lines and equalize thermic expansion between the semi-conductor substrate and the coarse structure of the connection legs of the carrier system.

As a further advantage of the invention, the metallic carrier system may be produced by etching from a multi-layer material, the layers of which may be of different etching resistance to selectively etch the inner feed lines and the outer connection legs through the application of etching masks.

A further advantage of the invention is to provide two different etching agents, one for etching the inner feed lines and the other for etching the outer connection legs, in which the fine structure of the inner feed lines may be etched slower than the coarse structure of the connection legs, in comparison with the thickness ratio between the inner feed lines and the outer connection legs.

In the etching process, a covering mask may be produced on a carrier sheet by a photo-lithographic process and produce the inner feed lines by galvanic deposition of the metal, while not affecting the metal of the carrier sheet, and then removing the covering mask and covering the fine structure of the feed lines with a protective lacquer and etching mask, for the production of the outer connection legs by selective etching.

It is also of advantage to recess the carrier sheet in the regions of the paths of the inner feed lines to produce curved expansible sections in the inner feed lines as galvanically deposited thereon, to attain the desired shape and yieldability of the inner feed lines.

A further advantage of the invention is that is possible to deposit galvanically two layers of different metals, for example copper and nickel, which form together the inner feed lines. The layer directly connected with the electrodes of the semi-conductor-chip can then be made very thin.

Other objects, features and advantages of the invention will be readily apparent from the following description of certain preferred embodiments thereof, taken in conjunction with the accompanying drawings, although variations and modifications may be effected without departing from the spirit and scope of the novel concepts of the disclosure.

DESCRIPTION OF PREFERRED EMBODIMENTS OF INVENTION

In the embodiment of the invention illustrated in FIGS. 1 through 5 of the drawings, we have shown a carrier sheet 2, which may be made from brass of a thickness in the order of 0.3mm. A layer of photopolymer material may be applied to both sides of the sheet and a covering mask 1 which may be a galvanic covering mask, may be produced from the layer of photopolymer material by a conventional photo-lithographic process, as for example, by the photo-litographic processes used in the production of printed circuits.

Figure 2:
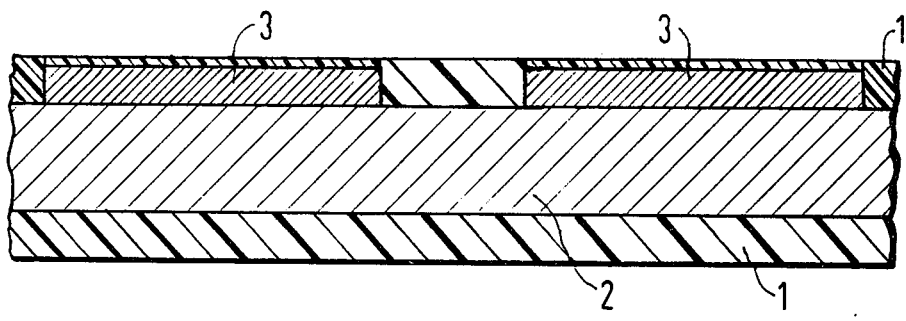
FIG. 2 is a fragmentary sectional view taken substantially along line I—I of FIG. 1.
Figure 1:
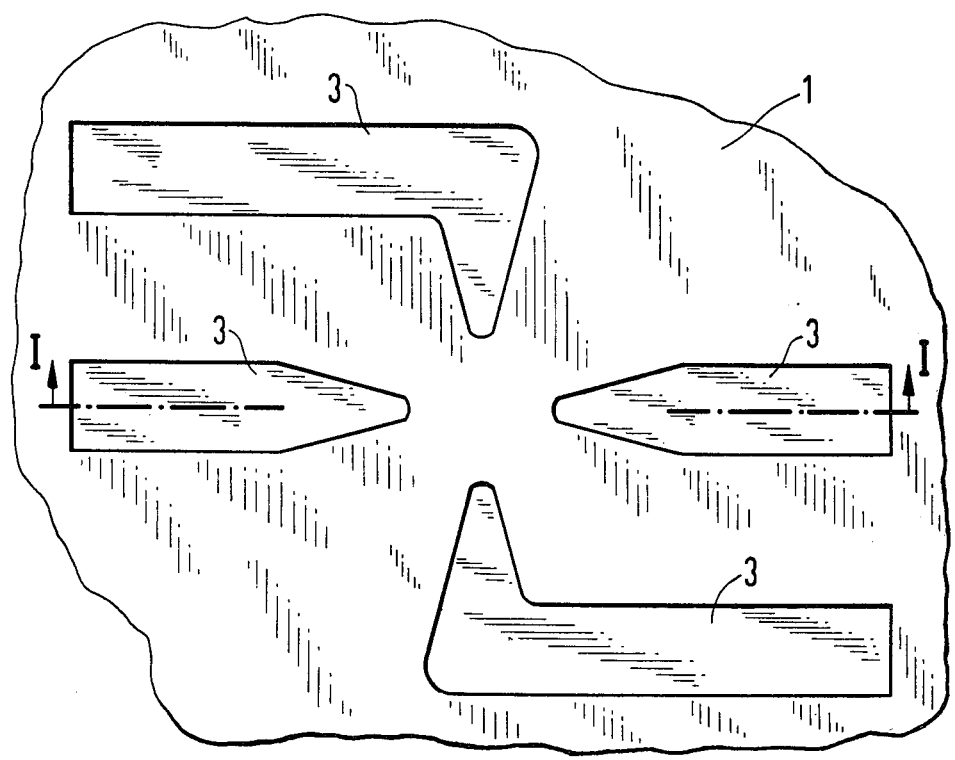
FIG. 1 is a diagrammatic plan view of a carrier system constructed in accordance with the principles of the present invention showing a galvanic covering layer extending over the carrier with the portion forming the inner feed lines uncovered.

In producing the covering mask, the positions where the thin feed lines are to occur will be left open. The covering mask 1 which may be a galvanic covering layer is then applied to the brass carrier sheet, with the open portions thereof defining the areas where the feed lines are to occur, as shown in FIG. 1.

Nickel is then galvanically deposited in the open portions of the carrier sheet in a well known manner, up to the height of the photo-polymer layer. As for example, the deposit of nickel may be 50um in thickness.

Figure 4:
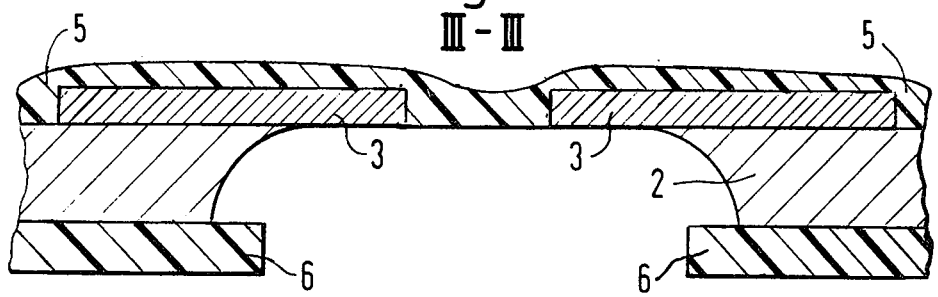
FIG. 4 is a fragmentary sectional diagrammatic view taken substantially along line III—III of FIG. 3.

The galvanic covering layer 1 is then removed and the deposited nickel inner feed lines 3 are covered with a protective lacquer, which may be a solder lacquer and indicated by reference numeral 5 in FIG. 4.

Figure 3:
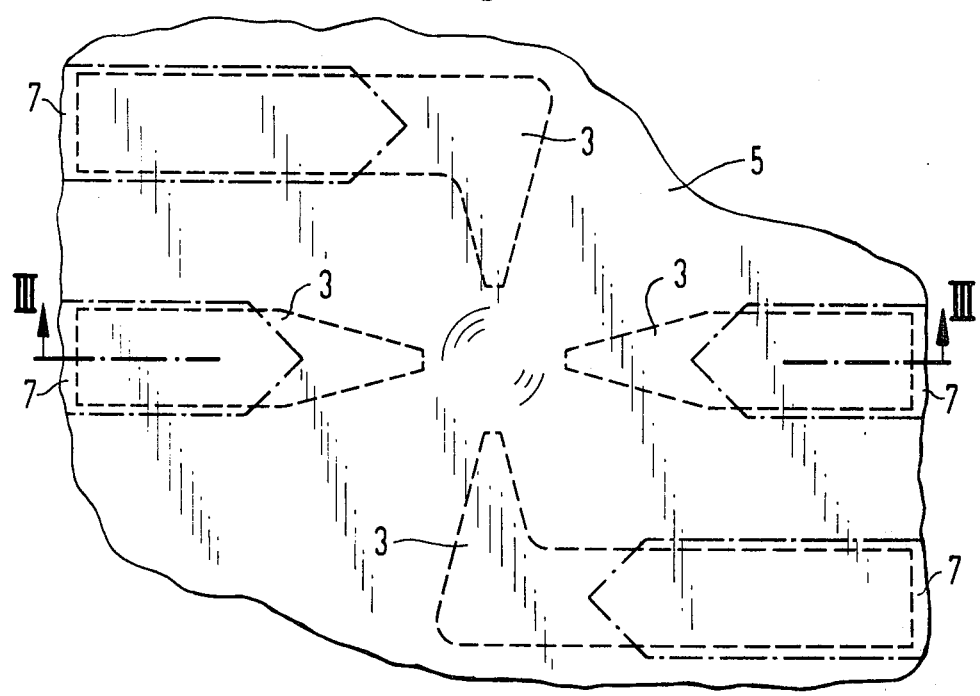
FIG. 3 is a diagrammatic plan view illustrating the etching of the connection legs from the carrier sheet and leaving the inner feed lines untouched.

An etch covering 6 (FIG. 4)may then be applied to the reverse side of the carrier sheet either by the photoprinting or the screen printing method. The metal sheet is then etched to form a mounting frame 21 (FIG. 10) and the outer brass connecting legs 7 as shown in FIG. 3. This etching operation may be carried out by the application of a suitable etching agent which attacks only the brass carrier sheet, but not the nickel inner feed lines. Such etching agent may be a commercial form of etching agent well known to those skilled in the art, so not specified herein.

Figure 5:
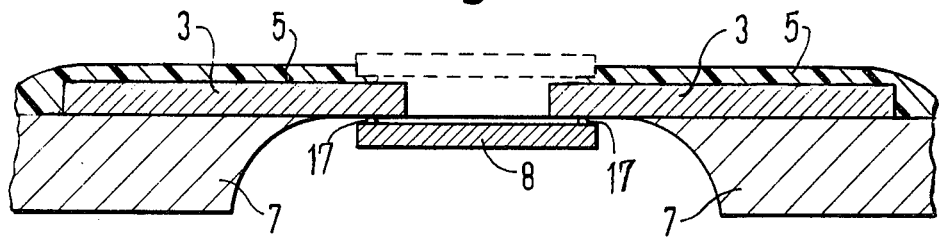
FIG. 5 is a fragmentary diagrammatic sectional view taken through a finished carrier showing the inner feed lines connected with a semiconductor chip.

The etching media used may be of various types known to the art and may be a selective etching agent which attacks only brass or nickel or may be etching agents which attack both nickel and brass at different rates. The protective lacquer 5 applied prevents the fine structure of the inner feed lines 3 from being exposed to the etching medium during the entire etching time. In etching the outer connecting legs, the central portion of the sheet is etched out to provide a space for a semi-conductor chip 8 having electrodes 17 which may be attached to the ends of the inner feed lines by welding, soldering or gluing, as shown in FIG. 5. Prior to the attaching of the semi-conductor chip, the solder lacquer extending along the ends of the thin feed lines 3 is removed, but may be retained along the tops of the feed lines as a protective covering.

Figure 6:
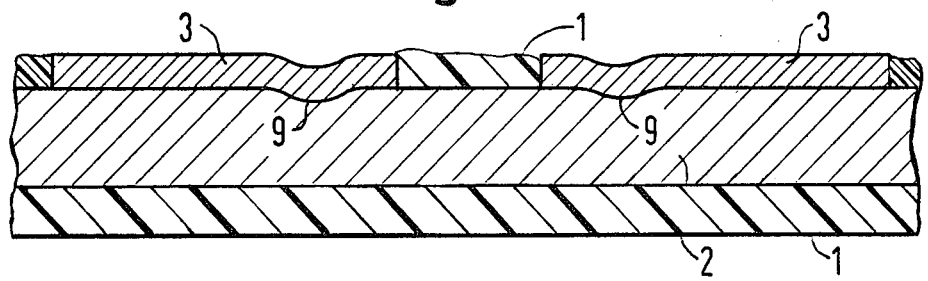
FIGS. 6 and 7 are fragmentary diagrammatic sectional views taken through a carrier in the process of manufacture in the completed carrier, illustrating another form in which the invention may be carried out.
Figure 7:
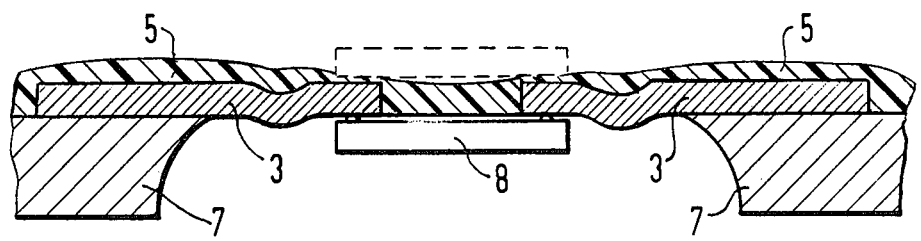

In the embodiment of the invention illustrated in FIGS. 6 and 7, the carrier system and contact and support for the semi-conductor chip is formed in a manner similar to the form of the invention illustrated in FIGS. 1 through 5. In this form of the invention, in order to compensate for the difference in expansion between the relatively coarse brass connections and the semi-conductor chip, the feed lines have depressed uniformly curved generally U-shaped recessed portions intermediate their ends, to provide an accordian-like effect and increase the yieldability thereof.

In order to attain these recesses, recesses 9 are etched into the top surface of the carrier sheet 2 before the production of the inner feed lines 3 and in the areas of the feed lines. A galvanic cover 1 is then applied in the manner described with relation to the form of the invention illustrated in FIGS. 1 through 5 with free spaces for the depositing of nickel to form the inner feed lines 3. The feed lines as formed by galvanic deposition, will conform to the recesses 9 and have uniformly curved generally U-shaped intermediate expansion portions extending into the recesses after etching of the connection legs 7 from the projecting portions of the feed lines. The process of etching the connection legs may be the same as that shown and described in connection with FIGS. 1 through 5.

Figure 8:
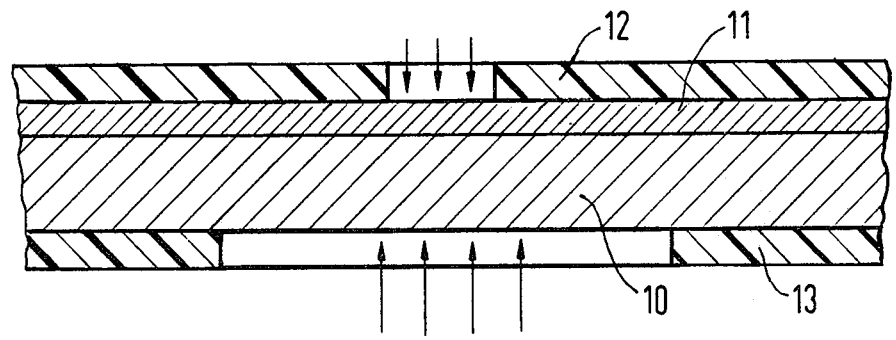
FIGS. 8 and 9 are views somewhat similar to FIGS. 6 and 7, but diagrammatically illustrating still another form in which the invention may be carried out.
Figure 9:
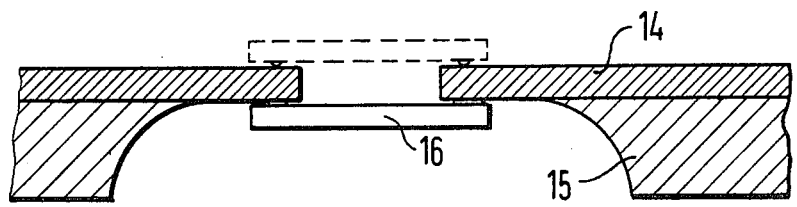

In the form of the invention illustrated in FIGS. 8 and 9, the formation of the carrier with the inner nickel feed lines and the outer brass connection legs is from a two-layer material having a relatively thick brass layer 10 and a thinner nickel layer 11 applied thereto. An etching coating 12 formed by conventional photo-lithographic methods is then applied to the nickel layer for the production of the inner feed lines by etching the nickel from the brass by the use of a suitable etching agent.

An etched covering 13 is then applied to the brass side of the material, covering the parts of the brass sheet 10 which are to form the outer connection legs and the mounting frame 21. The connection legs are then etched out by an etching agent which will not attack the nickel layer.

In FIG. 9, a section through a metallic carrier system is shown which has been produced in accordance with this last-mentioned method, where the inner feed lines are etched out of the nickel layer 11 and the outer connection lines are etched out of the brass layer 10 in the manner previously described. A semi-conductor chip 16 is shown in solid as being applied to the underside of the inner feed lines by welding, soldering or gluing.

We have also shown in dotted line the application of the semiconductor chip to the outer surfaces of the feed lines as an alternate supporting and connection means for the semi-conductor chip.

Figure 10:
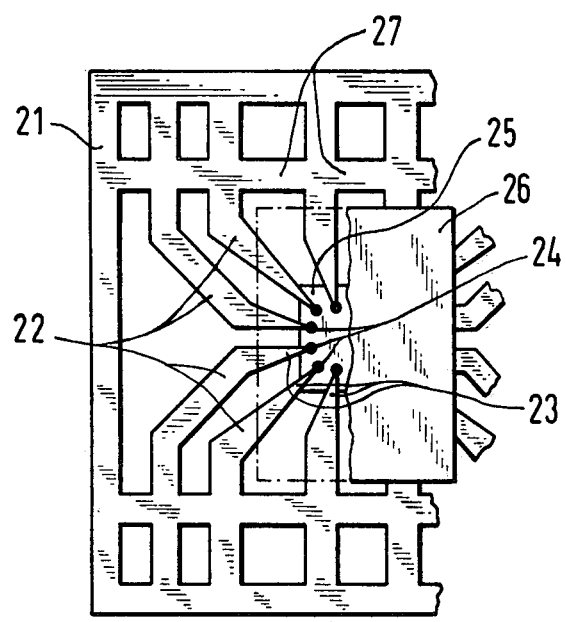
FIG. 10 is a fragmentary top plan view illustrating a finished metallic carrier system.

FIG. 10 illustrates in plan a portion of a completed metallic system carrier comprising the mounting frame 21 made from the brass carrier sheet 2 with the inner feed lines 22 extending from the mounting frame, tongue-like towards the center of the frame. A semiconductor chip 25 is provided with electrodes 24, which are connected to the ends of the tongue-like inner feed lines with one end of each feed line in contact with one electrode. The electrodes may be permanently connected with the ends 23 of the feed line as by welding, soldering or gluing. The feed lines and semiconductor chip may then be encapsulated in a plastic block 26. The frame 21 and connections 27 are then removed between the connection legs and the parts of the feed lines and connection legs extending to the outside of the plastic casing 26 may be inserted into the receptacles of an electric device in a manner well-known to those skilled in the art so not herein shown or described further.

We claim as our invention:

1. A method for producing a metallic carrier system for a multi-electrode semi-conductor chip comprising the steps of:
   a. providing a base carrier sheet of a first metal that can readily be soldered;
   b. etching recesses in the carrier sheet in portions of the carrier sheet to be covered by inner feed lines;
   c. applying covering masks to opposite sides of the sheet by photolithographic process with open portions in the mask on one side of the carrier sheet conforming to the inner feed lines;
   d. producing inner feed lines with recessed expansible portions by the galvanic deposition of at least a second metal in the open portions of the mask, and into said recesses, said second metal being of a type capable of being readily connected to a semiconductor body;
   e. covering the feed lines with protective layers; and
   f. then etching the outer carrier legs from the opposite side of the sheet in accordance with the pattern of the covering mask applied thereto by selective etching;
   the recessed expansible portions of the feed lines compensating for the difference in expansion between the connection legs of the carrier sheet, the inner feed lines and the semi-conductor chip.

2. The method of claim 1 in which the first metal is brass and the second metal is nickel.

3. The method of claim 1 including the step of attaching the inner feed lines to the electrodes of the semiconductor chip, and then encapsulating the inner feed lines and electrodes in a plastic material.

4. A method for producing a metallic carrier system for a multi-electrode semi-conductor chip comprising the steps of:
   a. providing a base carrier sheet of a first metal that can readily be soldered;
   b. applying covering masks to opposite sides of the sheet by photolithographic process with open portions in the mask on one side of the carrier sheet conforming to the inner feed lines;
   c. producing the inner feed lines by the galvanic deposition of at least a second metal in the open portions of the mask and of a type capable of being readily connected to a semi-conductor body;
   d. covering the feed lines with etching protective layers to protect the lines from etching; and
   e. then etching the carrier sheet to form outer circuit connection legs from the opposite side of the sheet in accordance with the pattern of the covering mask applied thereto by selective etching.

5. The method of claim 4 in which the first metal is brass and the second metal is nickel.

6. The method of claim 4 including the step of attaching the inner feed lines to the electrodes of the semiconductor chip, and then encapsulating the inner feed lines and electrodes in a plastic material.

* * * * *